United States Patent [19]

Schumaker et al.

[11] Patent Number: 4,772,356

[45] Date of Patent: Sep. 20, 1988

[54] GAS TREATMENT APPARATUS AND METHOD

[75] Inventors: Norman E. Schumaker; Richard A. Stall, both of Warren; Craig R. Nelson, Green Village; Wilfried R. Wagner, Basking Ridge, all of N.J.

[73] Assignee: Emcore, Inc., South Plainfield, N.J.

[21] Appl. No.: 881,628

[22] Filed: Jul. 3, 1986

[51] Int. Cl.[4] .............................................. C23C 16/00
[52] U.S. Cl. ................................. 156/613; 23/294 R; 156/610; 156/611; 118/730
[58] Field of Search ................ 118/730; 156/613, 610, 156/611; 23/294 R

[56] References Cited

U.S. PATENT DOCUMENTS

| | | | |
|---|---|---|---|
| 3,384,049 | 5/1968 | Capita | 118/730 |
| 3,407,783 | 10/1968 | Capita | 118/730 |
| 3,408,982 | 11/1968 | Capita | 118/730 |
| 3,659,552 | 5/1972 | Briody | 118/730 |
| 3,885,061 | 5/1975 | Corboy et al. | 156/613 |
| 4,485,759 | 12/1984 | Brandolf | 118/730 |
| 4,579,080 | 4/1986 | Martin et al. | 118/730 |

FOREIGN PATENT DOCUMENTS

| | | |
|---|---|---|
| 144958 | 2/1977 | Japan . |
| 144960 | 2/1977 | Japan . |
| 144961 | 2/1977 | Japan . |
| 0207622 | 11/1984 | Japan .................................. 118/730 |
| 0042762 | 3/1985 | Japan .................................. 118/730 |
| 6090894 | 5/1985 | Japan . |

*Primary Examiner*—Asok Pal
*Attorney, Agent, or Firm*—Lerner, David, Littenberg, Krumholz & Mentlik

[57] ABSTRACT

Substrates such as semiconductor wafers are treated with a gas by advancing the substrate along a path, preferably a circular path through the gas while maintaining a face of the substrate transverse, preferably oblique, to the path so that the gas contacts be exposed from the face of the substrate. Preferably, a plurality of substrates are treated simultaneously, and the substrates serve as vanes to impel the gas into rotational motion, thereby pumping the gas through the process chamber. Preferably, the substrates are carried on susceptors having generally planar faces, the susceptors also serving as vanes impelling the gas into rotational motion. The gas may be a depositing gas for forming epitaxial layers on the faces of the substrates, or an etching gas.

17 Claims, 4 Drawing Sheets

GAS TREATMENT APPARATUS AND METHOD

BACKGROUND OF THE INVENTION

The present invention relates to apparatus and methods for treating solid substrates with a gas.

One gas treatment process which is widely utilized in production of semiconductor devices is the gas deposition process. In this process, a substrate such as a planar wafer of silicon or other suitable material is exposed to gases which react at the substrate to deposit the desired materials on the front face of the wafer. Typically, the deposited materials form epitaxial films which replicate the crystal lattice structure of the underlying substrate. Several different reactive gas mixtures may be employed in succession to deposit layers of differing composition. Thus, a mixture of hydrogen, silicon halides and halides of a desired minor ingredient or dopant may be contacted with the wafers while heating the wafers. Upon contact with the heated wafer surface, the gases react to deposit a layer of silicon containing the desired dopant on the wafer surface. The process is repeated using different dopants to provide a multilayer semiconductor structure including several layers having different dopants. Similar processes may be employed with mixtures of trimethyl gallium and arsine to deposit layers of gallium arsenide, likewise with desired dopants or minor ingredients.

The coated wafers are subjected to well known further processes to form devices such as integrated circuits. The layers deposited on the wafer in the gas deposition process form the active elements of microscopic transistors and other semiconductor devices included in the integrated circuits. The thickness, composition and quality of the deposited layers determine the characteristics of the resulting semiconductor devices. Accordingly, the gas deposition process must be capable of depositing films of uniform composition and thickness on the front face of each substrate. The requirements for uniformity have become progressively more stringent with the use of larger wafers and with the continuing reduction in the size of the semiconductor devices fabricated from the coated wafer.

It has been difficult heretofore to maintain a large number of substrates at a uniform temperature. Typically, the substrates have been heated by contact with electrically conductive supports or susceptors which in turn have been heated by electromagnetic fields. Nonuniformities in the electromagnetic fields have typically resulted in non-uniform heating of the susceptors and wafers, resulting in non-uniform reaction of the gas at the substrates, and hence in non-uniform deposition. Moreover, nonuniformities in flow of the depositing gas over the wafer surfaces heretofore have resulted in nonuniform contact between the gas and substrate and hence in nonuniform deposition. These difficulties become more severe when a plurality of wafers are processed simultaneously. Further, the apparatus utilized heretofore typically has not been well suited to rapid loading and unloading. Thus, considerable time is consumed in placing the substrates or wafers within the chamber and removing them from the chamber.

Various attempts have been made to overcome some or all of these difficulties. As set forth in U.S. Pat. No. 3,460,510, a plurality of wafers may be mounted on either the exterior or interior surface of a cylindrical support disposed within a chamber, and the support may be rotated to provide a more uniform heat distribution. Likewise, U.S. Pat. No. 3,384,049 discloses vapor deposition apparatus with ring-like susceptors or supports, which are rotated about a vertical axis. The wafers or substrates are disposed in pockets on the interior surface of these ring-like susceptors, so that so-called centrifugal force retains the wafers in the pockets. The depositing gas is introduced into the chamber through a perforated feed pipe extending into the chamber along the vertical axis of rotation of the ring-like susceptors, so that the gas passes outwardly from the feed pipe and contacts the inwardly facing wafer surfaces. U.S. Pat. No. 3,659,552 teaches essentially the same approach. Further, U.S. Pat. Nos. 3,407,783 and 3,408,982, disclose vapor deposition apparatus in which the wafers or substrates are disposed on a rotatable disclike support, and the depositing gas is discharged through the center of the disclike support so that the gas flows radially outwardly over the faces of the wafers. The article "Characterization of GaAs Films Grown by Metal Organic Chemical Vapor Deposition," by Swaminathan et al, *Journal of Applied Physics*, Vol. 57, No. 12, pp. 5349 et seq., (1985) reports deposition of gallium arsenide films on substrates rotated at rotational speeds of between 50 and 1,000 revolutions per minute on a rotary pedestal within a bell jar reactor.

Although the methods and apparatus set forth in the aforementioned references are said to ameliorate the difficulties in the gas deposition process, there have still been needs heretofore for further improvement.

Another gas treatment process applied to semiconductor wafers heretofore is gas etching. In the gas etching process, a wafer having a pattern of masking material on its surface is exposed to a gas, typically an ionized gas, also referred to as a plasma. The ions in the plasma attack those regions of the surface not covered by the masking material, thereby forming discrete microscopic features defining the semiconductor devices of integrated circuits. Difficulties similar to those referred to above in connection with the gas deposition process have also occurred heretofore in the gas etching process. Thus, nonuniform contact between the plasma and wafers, or nonuniform temperatures can lead to undesirable nonuniform etching rates. There have accordingly been corresponding needs for improvement in gas etching processes, and in other processes wherein a gas is employed to treat a solid substrate such as a semiconductor wafer.

SUMMARY OF THE INVENTION

The present invention provides improved gas treatment methods and apparatus.

As used in this disclosure, the term "gas" encompasses gases in their ordinary or unionized state, and also includes ionized gases or plasmas. The term "active gas" as used herein means a gas which, when contacted with the substrate will alter the substrate in any fashion. The term "depositing gas" means a gas capable of depositing a material on the substrate upon contact therewith, whereas the term "etching gas" means a gas, whether ionized or not, capable of etching the substrate upon contact therewith.

In a gas treatment method according to one aspect of the present invention, a substrate is advanced along a path through an active gas while the front face of the substrate is maintained transverse, preferably oblique, to the path of motion to thereby contact the front face of the substrate with the active gas. Preferably, the substrate is maintained in front face leading orientation, so that the front face or face to be treated advances into the gas as the substrate moves along the path. The path of the substrate may be a curve extending about an axis, such as a circle centered on the axis. As the substrate moves along the curve, it impels the gas into rotational motion about the axis, which in turn tends to force the gas outwardly, away from the axis.

In particularly preferred methods according to the present invention, a plurality of substrates are rotated about an axis within a chamber and the active gas is admitted to a central region of the chamber adjacent the axis. The active gas is discharged from the chamber at a peripheral region, remote from the axis and outside the path of the substrates. Thus, the moving substrates themselves pump the gas from the central region to the peripheral region and hence pump the gas through the chamber in a manner similar to the pumping action of a centrifugal pump, with the substrates serving as the vanes of the pump. Most preferably, the front face of each substrate is maintained at a rake angle greater than 0° and less than 90°, so that the front face of each substrate faces inwardly towards the axis as well as forwardly along the circular path described by the substrate. In particularly preferred methods according to this aspect of the present invention, plural substrates are arranged in an array, typically a generally cylindrical array extending around the axis. Where the array includes only a single loop-like layer of substrates, each portion of the active gas contacts only one of the substrates in passing from the central region of the chamber to the peripheral region.

Where the active gas is a depositing gas, uniform coatings can be deposited at substantial rates on a plurality of substrates such as semiconductor wafers simultaneously by the preferred methods according to the present invention. Although the present invention is not limited by any theory of operation, it is believed that the combination of uniformity and deposition rate achievable by methods according to the present invention is related to maintenance of a substantially laminar flow regime in the vicinity of the wafer or substrate surface even at relatively high gas velocities across the wafer surface. It is believed that the orderly, laminar flow in the vicinity of the front face is enhanced by the continual advance of the front face into the gas and further enhanced by the centripetal acceleration of the substrates, which produces an apparent "centrifugal force" appearing to act on the gas as it moves in rotation about the axis with the moving substrates. Moreover, the motion of the wafers or substrates through the chamber continually exposes each wafer or substrate to gas flowing through the chamber along various paths and hence compensates for differences in the flow along the various paths through the chamber.

Additionally, the present gas deposition methods can provide the desired, uniform, high velocity flow of depositing gas across the wafer surface even at relatively high pressures, viz, pressures above about 0.1 atmosphere. Although the present methods can also provide the desired flow patterns at lower pressures, these relatively high pressures, higher than typically utilized in forming high quality, uniform epitaxial films, tend to promote more efficient use of the reactive components in the depositing gas. Thus, it is believed that gas deposition methods according to preferred aspects of the present invention tend to minimize the need for excess reactants in the depositing gas and hence tend to minimize pollution cause by excess reactants.

According to further aspects of the present invention, the techniques described above may be employed in etching procedures. Thus, an etching gas, rather than a depositing gas, may be contacted with the substrates in substantially the same fashion.

Yet another aspect of the present invention provides gas treatment apparatus. Preferred gas treatment apparatus according to this aspect of the present invention includes a chamber, inlet means for introducing an active gas into the chamber and exhaust means for removing the active gas from the chamber. Substrate handling means are provided for holding a substrate and moving the substrate along a path within the chamber while maintaining the front face of the substrate transverse to the path to thereby contact the front face of the substrate of the active gas. Preferably, the substrate handling means is operative to move the substrate along a curve extending around an axis and to maintain the substrate at a rake angle greater than 0° but less than 90°, so that front face of the substrate faces forwardly in the direction of motion of the substrate end inwardly, toward the axis. The inlet means preferably introduces the coating gas into a central region of the chamber adjacent the axis, whereas the exhaust means preferably removes the gas from a peripheral region of the chamber outside of the curve, remote from the axis.

The apparatus preferably includes rack means for maintaining a plurality of substrates in a generally cylindrical array centered on the axis and rotation means for rotating the rack means about the axis to thereby rotate the array of substrates about the axis. Thus, each substrate will move along a circular path centered on the axis. Preferably, the rack means includes a plurality of susceptors, each having a generally planar face. Each susceptor may be adapted to retain a plurality of substrates on its generally planar face so that the front face of each substrate extends generally parallel to the generally planar face of the susceptor. The planar faces of the susceptors thus cooperate with the front faces of the substrates in impelling the depositing gas around the axis so as to provide centrifugal pumping action, forcing the active gas radially outwardly, away from the axis. The faces of the susceptors serve to guide the flowing gas into the desired flow pattern as the gas passes through the gaps between the susceptors and over the front faces of the substrates. Each susceptor may be an elongated, blade-like structure extending generally parallel to the axis. The susceptors may be disposed in a single layer extending around the axis. Each susceptor may be adapted to retain only a single row of substrates extending lengthwise along the susceptor. Thus, each portion of the active gas flowing radially outwardly within the chamber, through the gaps between the susceptors will contact only a single one of the substrates.

The rack means preferably includes a carousel structure rotatably mounted within the chamber. The susceptors may be releasably mounted to the carousel structure, and the chamber may include opening means such as a handling port for access to the susceptors. One set of susceptors may be unloaded and reloaded with new substrates outside of the chamber while the chamber is in use with another set of susceptors to treat another batch of substrates. Accordingly, the apparatus may be operated almost continuously, with only the brief interruptions required for insertion and removal of susceptors. The apparatus most preferably includes electrical resistance heaters for heating the susceptors. In a particularly preferred arrangement, a plurality of electrical resistance elements are mounted to the carousel structure, each such element including a sheet-like resistive portion. Each susceptor preferably includes a metallic plate defining both a generally planar front face and a rear face, the rear faces of the susceptors confronting the sheet-like resistive portions of the heating elements.

The carousel structure may include a pair of end discs extending transverse to the axis at axially spaced locations and defining a gap therebetween. The susceptors preferably are disposed in the gap between the end discs. The inlet means may discharge the depositing gas into the gap, so that the depositing gas flows radially outwardly within the gap. The apparatus may include a central axle fixed to the housing and extending through at least one of the end discs of the carousel, and the inlet means may include an injector tube mounted on the central axle.

The present invention also provides a subcombination incorporating the elements of the apparatus other than the removable susceptors. The apparatus of the subcombination may be used in conjunction with separately supplied susceptors to provide the functions set forth above.

These and other objects, features and advantages of the present invention will be further apparent from the detailed description of the preferred embodiment set forth below, taken in conjunction with the accompanying drawings.

DETAILED DESCRIPTION OF THE PREFERRED EMBODIMENTS

Figure 1:
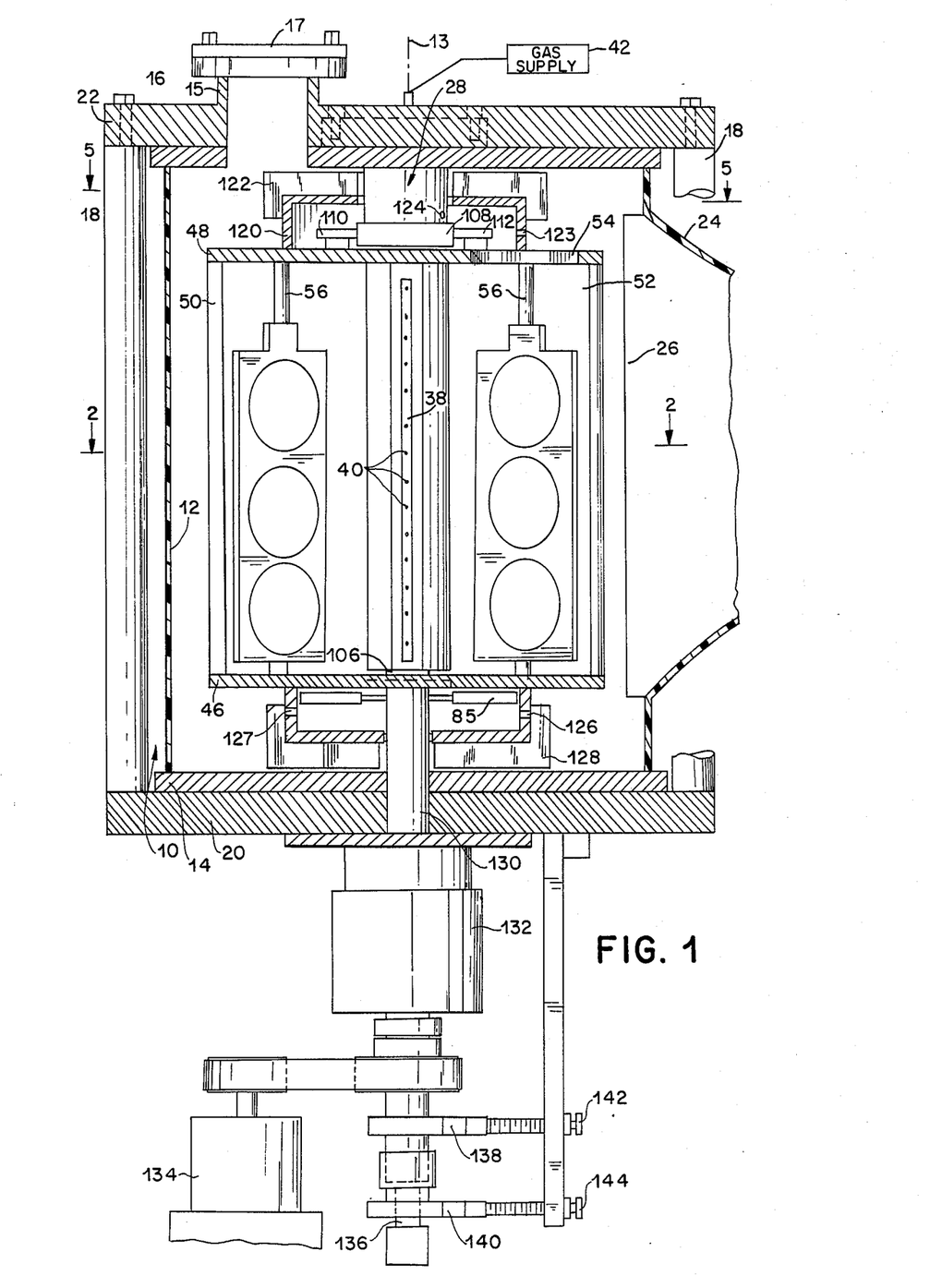
FIG. 1 is a cross-sectional, elevational view of apparatus according to one embodiment of the present invention.

Apparatus according to one embodiment of the present invention includes a chamber 10 having a generally cylindrical peripheral wall 12 centered on an axis 13, a bottom end wall 14 and a top end wall 16. The top and bottom end walls, 16 and 14, respectively, of the chamber 10 are maintained in a sealing engagement with the peripheral wall 12 by tie rods 18, base plate 20 and top plate 22. A handling port 15 extends through both top end wall 16 and top plate 22 providing access into the chamber 10, the handling port being closed by releasably mounted closure plate 17.

Figures 2, 6:
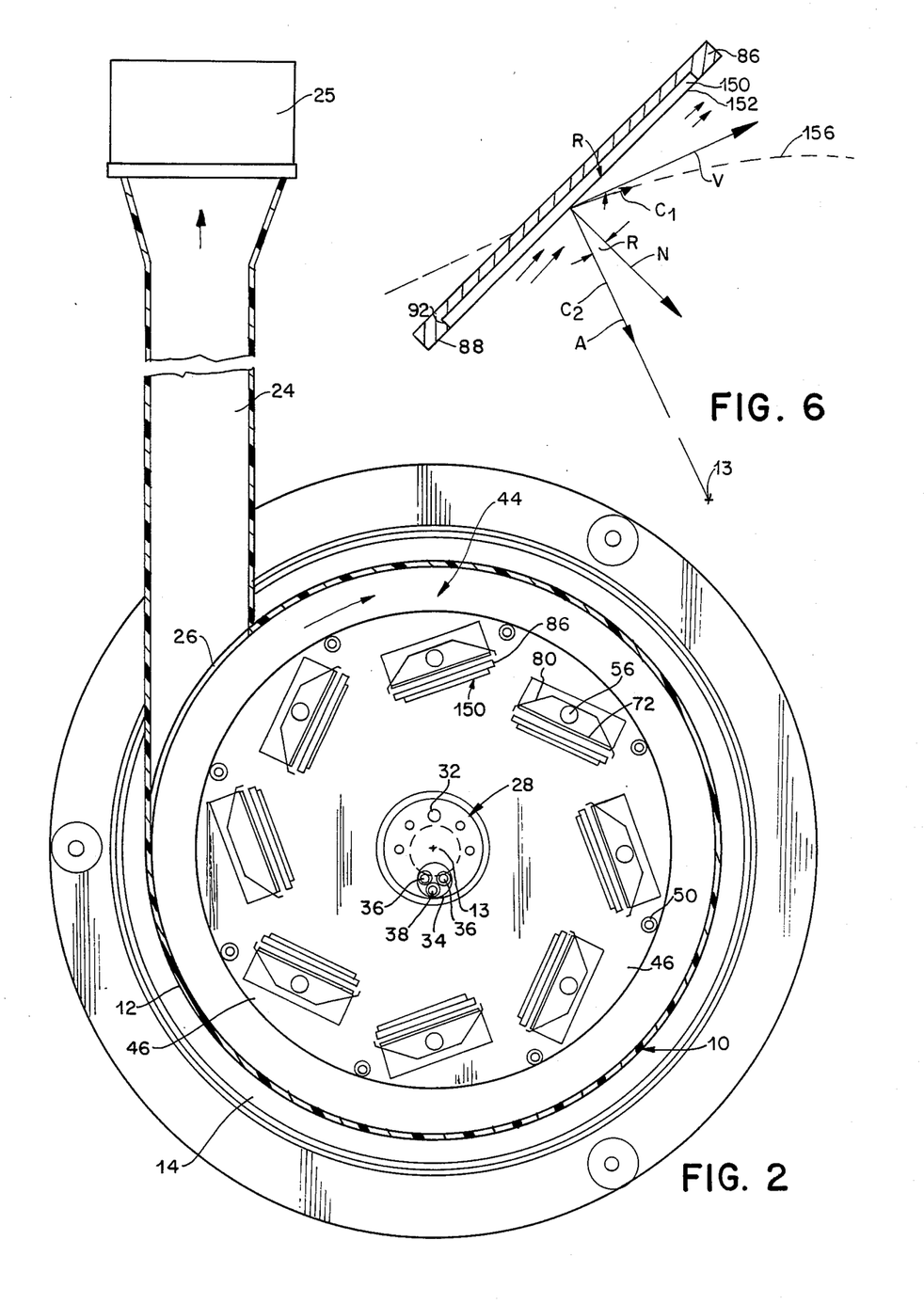
FIG. 2 is a cross-sectional view taken along line 2—2 in FIG. 1.
FIG. 6 is a schematic view depicting a portion of the apparatus illustrated in FIGS. 1-5.

The interior of chamber 10 is connected to an exhaust duct 24 via an elongated slot-like opening 26 in peripheral wall 12, the slot-like opening 26 extending generally parallel to the axis 13. As best illustrated in FIG. 2 exhaust duct 24 extends generally tangentially from the cylindrical chamber 10. The downstream end of duct 24 is connected to gas disposal means 25, which incorporates conventional devices such as pumps and valves for controlling flow through duct 24.

A central axle 28 is fixedly mounted to top plate 22 and extends through the top end wall 16 of the chamber. The central axle 28 is provided with cooling water channels 30, and with a sweep gas channel 32 (see FIG. 2). An active gas injector assembly 34 also extends along center axle 28, parallel to axis 13. The active gas injector assembly 34 includes cooling water tubes 36 and a active gas injector tube 38. As can best be seen in FIG. 1, active gas injector tube 38 is provided with a plurality of small holes 40 disposed at axially spaced locations along at least part of the length of the injector tube. The active gas injector tube 38 is connected to an active gas source 42. Active gas source 42 includes devices (not shown) for supplying a plurality of different depositing gases in sequence, at controlled flow rates and pressures, and for supplying an inert purge gas between different depositing gases. Sweep gas tube 32 (FIG. 2) is connected to a source (not shown) of an appropriate inert sweep gas.

A carousel structure 44 is rotatably mounted within chamber 10. The carousel structure 44 includes a bottom end disc 46 and a top end disc 48 connected to one another by carousel tie rods 50. The top and bottom end discs 48 46, respectively, extend perpendicular to axis 13 and are maintained in axially spaced relation with one another by the carousel tie rods 50 so that the discs define a gap 52 therebetween. A plurality of slot-like apertures 54 (see FIG. 5) extend through top end disc 48. Each of the slot-like apertures 54 is disposed at the same radial distance from axis 13, and handling port 15 is disposed at essentially that same radial distance from the axis 13. Thus, each of the indicated apertures 54 may be serially aligned with the handling port 15 by rotation of the carousel structure 44. The carousel structure 44 also includes a plurality of tubular ceramic susceptor support shafts 56 extending between the top and bottom end discs 48 and 46, respectively.

Figure 3:
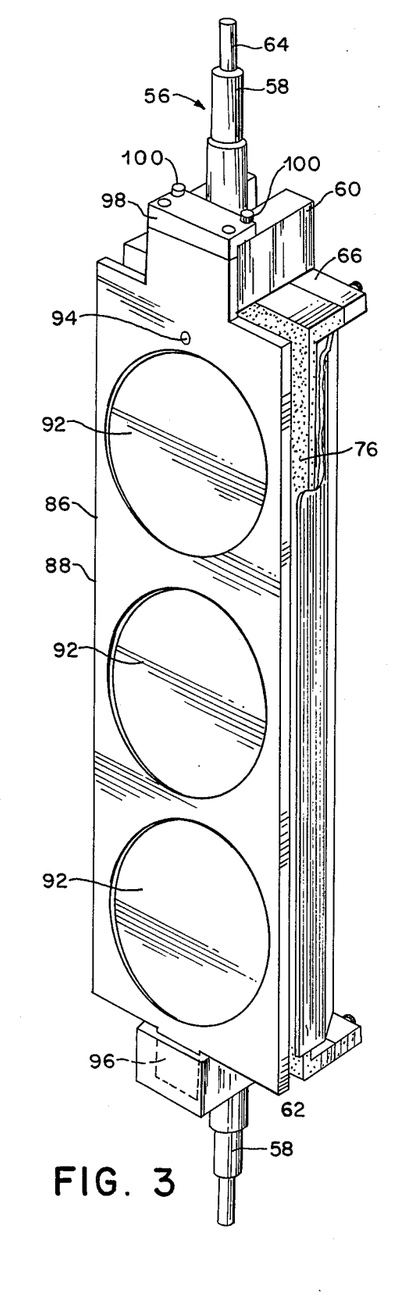
FIGS. 3 and 4 are, respectively, perspective and elevational views depicting a subassembly of the apparatus illustrated in FIGS. 1 and 2.
Figure 4:
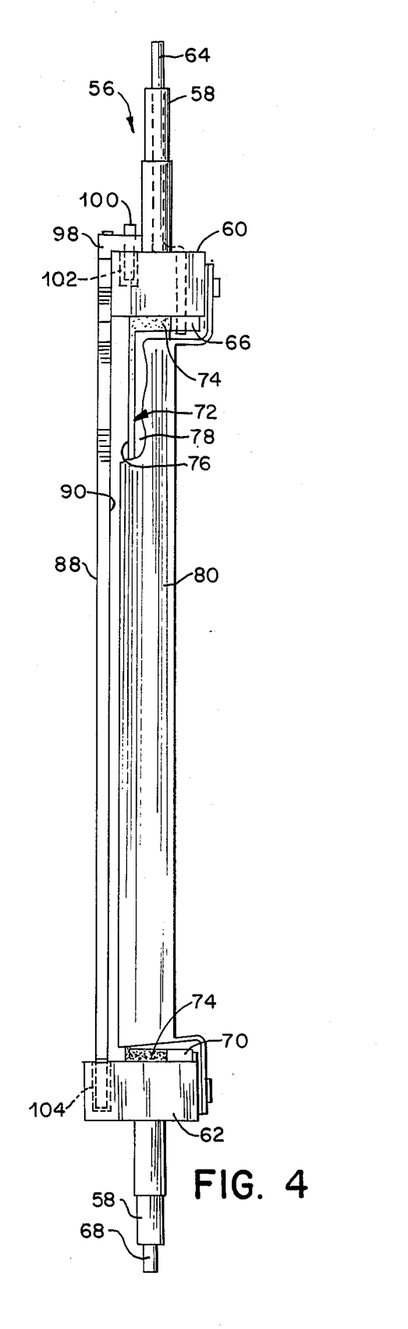

As most clearly illustrated in FIGS. 3 and 4, each such susceptor support shaft 56 includes a pair of generally cylindrical bearing surfaces 58 at the ends of the shaft. Each of the susceptor support shafts 56 is mounted to the top and bottom end discs by means of the respective bearing surfaces 58 on each support shaft being received in a pair of aligned holes in the top and bottom end discs 48 and 46, so that the susceptor support shafts 56 can pivot about their respective axes. The axis of each of the susceptor support shafts 56 extends parallel to central axis 13, and all of the susceptor support shafts are disposed at the same distance from the central axis. A ceramic top yoke 60 and a ceramic bottom yoke 62 are mounted to each susceptor support shaft 56 between its bearing surfaces 58. A metallic end stub shaft 64, preferably made of molybdenum, extends from the top end of each shaft 56. Each top end stub shaft 64 is mechanically and electrically connected to a metallic top spreader block 66, preferably made of molybdenum. A generally similar arrangement of a bottom metallic stub shaft 68 and bottom spreader block 70 is provided at the lower end of each susceptor support shaft 56. A graphite electrical resistance heating element 72 is electrically and mechanically connected to the spreader blocks 66 and 70 on each susceptor support shaft. Each such electrical resistance heating element 72 includes relatively thick end portions 74, juxtaposed with the spreader blocks, and a thin, sheet-like resistive filament portion 76 extending between the end portions. As can best be seen in FIG. 4, the sheet-like filament portions 76 are juxtaposed with a central portion 78 of the ceramic susceptor support shaft 56. A sheet metal heat shield 80 is mounted to the top and bottom ceramic yokes 60 and 62 so that the heat shield 80 overlies the back face of the electrical resistance heating element 72 and the central portion 78 of the ceramic support shaft.

Figure 5:
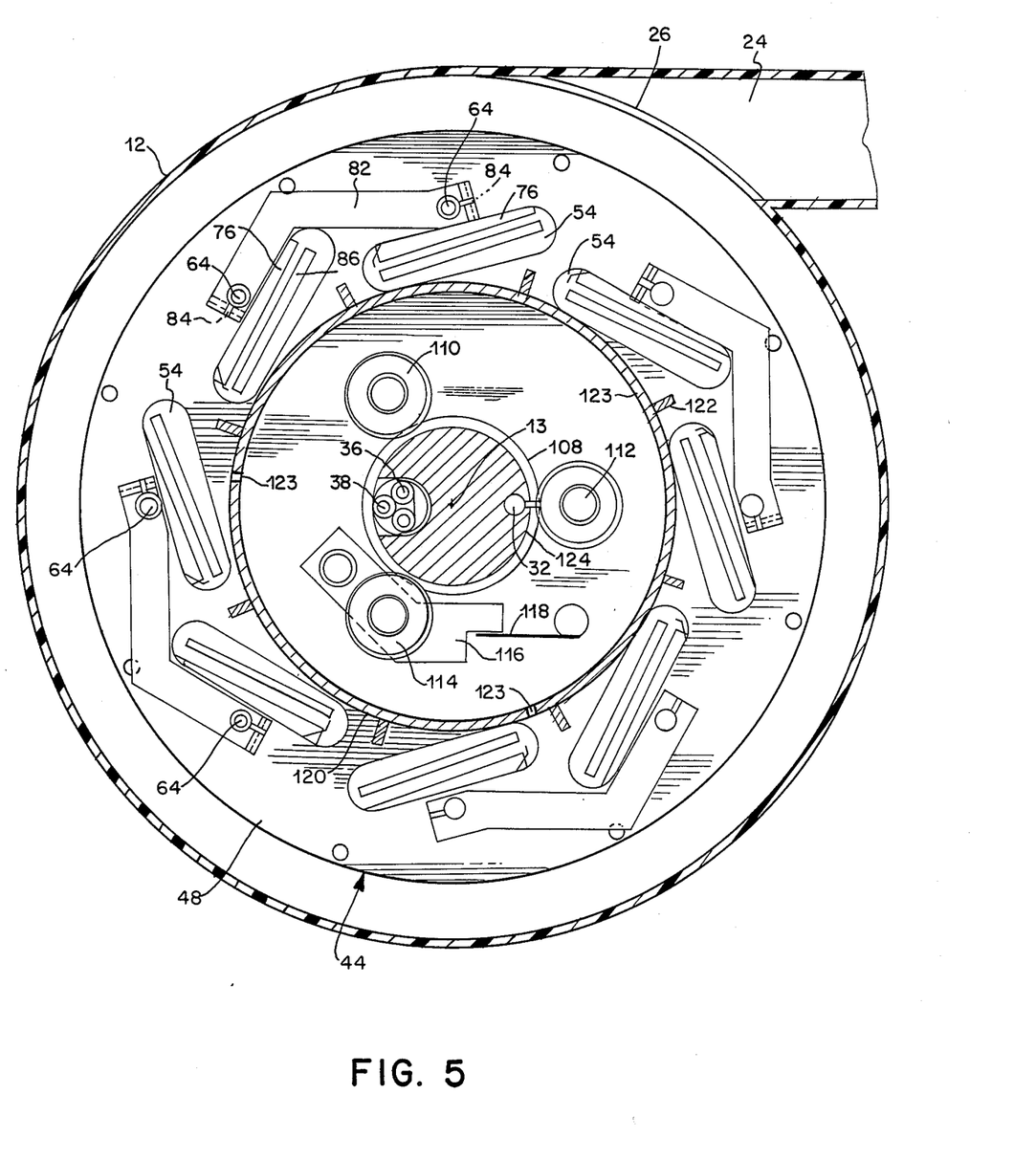
FIG. 5 is a cross-sectional view taken along line 5—5 in FIG. 1.

As can best be seen in FIG. 5, pairs of adjacent top end stub shafts 64 are connected to one another by electrically conductive metallic brackets 82. Set screws 84 mounted in brackets 82 retain the top end stub shafts 64, and hence the ceramic susceptor support shafts 56, against rotation relative to top end disc 48. A similar arrangement of brackets 85 (FIG. 1) is provided for electrically connecting pairs of adjacent bottom end stub shafts 68 (FIG. 4) to one another. The electrical interconnections of the top and bottom end stub shafts are arranged so that all of the electrical resistance heating elements 76 are interconnected in a single series circuit.

A plurality of plate-like metallic susceptors 86, preferably made of molybdenum, are releasably mounted to the carousel structure. As can best be seen in FIGS. 3 and 4, each susceptor 86 includes an elongated, plate-like portion having a generally planar front face 88 and a generally planar rear face 90. The front face of each susceptor 86 is provided with shallow circular pockets 92, these being arranged in a single row extending lengthwise along the elongated susceptor. The rear face 90 of susceptor 86 confronts the sheet-like filament portion 76 of electrical resistance heater 72. A fastener 94 is engaged with the susceptor 86 at the top of each pocket 92, so that the head of each such fastener slightly overlaps the edge of the pocket 92. Each susceptor 86 is provided with a tongue 96 projecting from the lower end of the plate-like portion, and bracket 98 connected to the upper end of the plate-like portion. Each bracket 98 is provided with a pair of pins 100. The pins are received in pockets 102 in the top ceramic yoke 60, whereas tongue 96 is received in a pocket 104 in the bottom ceramic yoke 62. Thus, the susceptor is releasably linked to the top and bottom ceramic yokes, 60 and 62, and hence to the susceptor support shaft 56 of the carousel structure. Although the susceptor is retained against movement transverse to the susceptor support shaft 56, the susceptor may be moved upwardly to disengage it from the yokes and hence from the susceptor support shaft. As best seen in FIG. 5, each susceptor is disposed in alignment with one of the apertures 54 in the top end disc of the carousel assembly.

The carousel assembly 44 is supported for rotation about axis 13 within chamber 10 on center axle 28. A lower ball bearing 106 connects bottom end disc 46 to the lower end of the center axle 28. Ball bearing 106 is arranged to resist both radial and axial motion of bottom end disc 46 relative to the center axle. A collar 108 is mounted to the center axle 28 adjacent the top end thereof so that the collar 108 is disposed on the upper or outboard side of top end disc 48, i.e., the side of the end disc outside of the gap 52 between the end discs. Three bearings 110, 112 and 114 are mounted to top end disc 48 on the outboard side of the disc so that the outer race of each of these ball bearings is in contact with collar 108, as can best be seen in FIG. 5. Bearings 110 and 112 are mounted directly to top end disc 48 by short stub shafts. Bearing 114 is mounted to an arm 116 which in turn is pivotably mounted to the top end disc 48 and biased towards axis 13 and hence towards collar 108 by a spring 118. A cup-like upper cover 120 encloses the bearings and collar. Vanes 122 are provided on the exterior surface of cover 120 and holes 123 extend radially through the cover. An orifice 124 connects the sweep gas channel 32 (FIG. 5) with the space adjacent the bearings and collar within cover 120. A similar cup-like lower cover 126 with holes 127 vanes 128 on its exterior surfaces is mounted to the bottom or outboard surface of bottom end disc 46, the lower cover enclosing brackets 85.

A drive shaft 130 extends through the lower end plate 14 of the chamber, the drive shaft being rotatably supported and sealed by a ball bearing and ferromagnetic fluid seal assembly 132. Drive shaft 130 is driven by a motor 134 and drivingly connected to the lower end disc 46 of the carousel assembly. The drive shaft is provided with an internal conductor 136 electrically insulated from the exterior portion of the drive shaft. Rotary contacts 138 and 140 electrically connect terminals 142 and 144, respectively, to the drive shaft 130 and the internal conductor 136. The drive shaft and the internal conductor are, in turn, connected by conductors (not shown) within cover 126 to the series circuit including the electrical resistance heaters 72 (FIGS. 3 & 4).

In one process according to the present invention, wafer-like substrates of a semiconductor material 150 are mounted in the pockets 92 of each susceptor 86 and retained by the fasteners 94 associated therewith. Each substrate or wafer 150 is flat and disclike, and has a substantially planar front face 152 (FIG. 6). The thickness of the wafers is matched to the depth of the pockets 92 so that the front face 152 of each wafer is substantially coplanar with the front face 88 of the associated susceptor 86. The eight susceptors 86 in the apparatus, each having three pockets, hold twenty-four wafers in a generally cylindrical array centered on axis 13. Set screws 84 (FIG. 5) are adjusted to lock the associated stub shafts 64 against rotation about its axis and hence to maintain the planar front face 88 of each susceptor 86 at a fixed angle Z to the radius 154 extending from the center of the planar face to the central axis 13. Typically, all of the susceptors are maintained at the same angle Z to their respective radii. As the front faces 152 of the wafers or substrates are coplanar with the planar faces of the susceptors, the front face of each wafer is likewise maintained at the same angle Z to the radial direction.

The drive motor is actuated to rotate the carousel structure 44, and hence the susceptors and the cylindrical array of wafers or substrates about central axis 13, in the clockwise direction as seen in FIG. 2. Electrical current is passed through all of the resistance heating elements 72 by way of the metallic spreader blocks 66 and 70 (FIGS. 3 and 4). Inasmuch as the elements are connected in series, and all have substantially equal resistances, each heating element 72 generates substantially the same amount of heat. The spreader blocks equalize the current flowing through each heating element so that substantially the same amount of current flows through each portion of each sheet-like filament 76, thus substantially the same amount of heat is generated per unit area in each portion of each sheet-like filament. As the susceptors 86 are substantially identical to one another, all reach substantially the same temperature and the temperature of each susceptor is substantially uniform. Thus, all of the substrates are maintained at substantially the same uniform temperature.

As the array of wafers or substrates rotates about central axis 13, each wafer moves along a circular path 156 (FIG. 6) centered on the axis. The front face 152 of each wafer is transverse to such circular path of motion. Stated another way, the vector N normal to face 152 at the center of such face has a component $C_1$ in the direction tangential to the path 156. Each wafer or substrate is disposed in front face leading orientation with respect to its direction of motion along path 156. That is, the tangential component $C_1$ of vector N normal to face 152 extends in the same direction as the instantaneous velocity vector V of the wafer or substrate along the path. The front face 152 of each wafer or substrate also faces inwardly towards central axis 13. Stated another way, the vector N normal to the front face also has a component $C_2$ directed towards the center of curvature of path 156 and hence directed towards central axis 13. The orientation of each wafer or substrate may be further characterized by the rake angle R, which is the angle between face 152 and the instantaneous velocity vector V, which in turn is equal to the angle between the normal vector N and the radial direction from the face to the center of curvature of the path. The rake angle of each susceptor, i.e., the angle between the vector normal to the front face 88 of the susceptor and the radial direction, is equal to the rake angle of the associated wafers. The rake angles of the susceptors and substrates can be adjusted by pivoting susceptor support shafts 56 about their respective axes. The rake angle of each susceptor and of each wafer or substrate is preferably greater than 0° but less than 90°, more preferably between about 5° and about 30°, and most preferably between about 8° and about 20°.

A purge gas is admitted to the interior of chamber 10 via active gas injection tube 38 and orifices 40. After the chamber has been purged, a depositing gas is likewise admitted through the active gas injection tube. As the substrates or wafers and susceptors move around axis 13, they impel the depositing gas along with them so as to impel the gas into rotational motion about the axis. The substrates or wafers and susceptors thus act in a fashion similar to the action of the vanes in a centrifugal pump. As the gas is impelled into rotational motion about the axis, it tends to move outwardly, from the central region adjacent axis 13 to the peripheral region of the chamber outboard of the path of the substrates and susceptors, adjacent the peripheral wall 12 of the chamber. The gas thus flows outwardly, across the planar faces of the susceptors and across the front faces of the substrates. As the gas flows generally radially and the susceptors and substrates move generally circumferentially, the substrates can be said to move substantially transversely to the direction of gas flow. Also, the forwardly and inwardly facing substrate faces are disposed oblique to the direction of gas flow. It is believed that each portion of the depositing gas thus impinges only once on the front face of one substrate in passing from the central region of the chamber to the peripheral region. As the gas contacts the hot substrates, it reacts to deposit the desired materials on the front face 152 of each substrate. The rate of gas flow through the apparatus, and the rate of deposition, are controlled by the gas pressure at the gas injection tube 38, the pressure differential created by the rotating substrates and susceptors, and the back pressure or vacuum applied at the downstream end of exhaust tube 24 by gas disposal means 25.

The rate of deposition on any portion of a front face of a substrate depends upon the temperature of that portion of the substrate and upon the conditions of contact between that portion of the substrate and the coating or depositing gas. As mentioned above, all of the susceptors and hence all of the substrates are maintained at substantially the same temperature to thereby promote equal deposition rates on all of the substrates. Moreover, because the susceptors are metallic, their thermal conductivity is relatively high. The high thermal conductivity of each susceptor tends to minimize temperature variation as between various locations on a given susceptor and hence to minimize temperature variations across the front face 152 of each wafer or substrate.

The contacting method and apparatus of the present invention promote uniform contact between the gas and the front face of each substrate. As each substrate moves along a circular path, it is accelerated inwardly towards the axis or center of curvature of the path with a radially directed centripetal acceleration indicated by vector A in FIG. 6. The substrate thus imparts a similar centripetal acceleration to the adjacent flowing gas. With respect to the substrate, the gas behaves as if it were subjected to a gravitational or "centrifugal force" field directed oppositely to the centripetal acceleration vector A and equal in magnitude thereto and hence having a component normal to the substrate front face. Preferably, each wafer or substrate moves about the axis with a centripetal acceleration of at least about 750 cm/sec$^2$, and more preferably at least about 2250 cm/sec$^2$. Moreover, because the front face of each substrate is impelling the adjacent gas in the tangential direction, the ram effect created by the substrate also tends to force the gas against the front face of the substrate. Thus, as the substrate or wafer is disposed in a front face leading orientation, the front face of each substrate is continually advancing along the path, preferably at a velocity of at least about 40 cm/sec, and more preferably at least about 100 cm/sec, into gas which is moving at a somewhat slower velocity than the substrate itself. This creates a ram effect which also causes the gas to behave as if it were under the influence of a gravitational field having a component normal to the face of the substrate and directed towards the substrate.

Although the present invention is not limited by any theory of operation, it is believed that both of these effects tend to maintain laminar flow of the gas across the face of the substrate. These effects are enhanced by the planar surface 88 of the susceptor. As the susceptor surface 88 is substantially flush with the substrate front face 152, the flowing gas is not substantially disturbed as it passes across the edges of the substrate or wafer. Any flow disturbances which may be created by the fastener heads 94 (FIG. 3) are of little consequence, inasmuch as gas impinging on the fastener heads and passing downstream therefrom contacts the susceptor face 88 rather than the front face of a substrate. Further, as each substrate advances along its circular path, it encounters gas flowing outwardly towards the peripheral wall at different locations around the circumference of the chamber. Thus, each portion of each substrate or wafer will be exposed to gas flowing outwardly at all locations around the circumference of the chamber, thereby compensating for any differences in the rate of radial flow around the circumference of the chamber.

Regardless of the actual mechanisms involved, deposition methods and apparatus according to the present invention provide an extraordinary combination of uniform contact across the front face of each substrate and high gas flow rates across the substrate face. The methods and apparatus utilized heretofore typically have required a compromise between these two factors. Thus, relatively high flow rates desirable to provide high rates of deposition on the substrate surface have heretofore created nonuniform deposition on the surface. With the present methods and apparatus, higher gas flow rates may be used while maintaining a given degree of uniformity or, conversely, better uniformity may be achieved for a given gas flow rate.

The methods and apparatus according to the present invention also minimize any differences in gas contact conditions as between the different substrates or wafers treated in the chamber at the same time. As mentioned above, each substrate or wafer passes around the entire circumference of the chamber. Thus, all of the substrates are exposed to the gas flow conditions prevailing at all circumferential locations within the chamber. Preferably, the orifices 40 in active gas inlet tube 38 (FIG. 1) are of different sizes and/or are spaced at nonuniform intervals along the length of the tube so as to compensate for differences in gas pressure along the length of the tube and provide a uniform rate of gas flow into the chamber per unit axial length.

The methods and apparatus according to the present invention also promote uniform deposition by minimizing socalled "depletion effects." As the depositing gas reacts to deposit constituents on a substrate, the gas is depleted of these constituents. However, with the method and apparatus described above, each portion of the depositing gas contacts only a single substrate as it passes from the central region of the chamber to the peripheral region. Every substrate or wafer is exposed only to fresh depositing gas which has not previously contacted another substrate. Therefore, nonuniformities in gas composition caused by depletion are effectively minimized.

A plurality of different depositing gases of differing compositions typically are employed to deposit different materials on the front faces of the substrate, thereby to form a multi-layer structure on the front face of each substrate. Thus, after a first depositing gas has been applied as described above, gas supply means 42 may terminate the flow of the first gas and then start the flow of a second coating gas of different composition. Typically, although not necessarily in all cases, the gas supply means injects an inert purge gas into the chamber through the gas inlet tube after the first depositing gas but before the second depositing gas. The methods and apparatus according to the present invention provide extremely rapid and well defined transitions between different gases. When the flow of one gas is replaced by another, the newly introduced gas tends to spread radially outwardly with the outward flow of the gases within the chamber, there being only minimal mixing of the new gas with the previously introduced gas. Such rapid transitions are desirable inasmuch as they minimize the thickness of transition regions between layers of differing compositions in the resulting wafer.

During the depositing steps mentioned above, an inert sweep gas is supplied via sweep gas tube 32. Some of the sweep gas injected by orifice 124 into the interior of cup-like cover 120 and hence in proximity to bearings 110, 112 and 114 (FIGS. 1 and 5). This sweep gas bathes the bearings and minimizes contact of the bearings with the depositing gases and hence minimizes formation of deposits on the bearings. The sweep gas passes out of the cover through holes 123 and is impelled by vanes 122 into rotational motion about axis 13, so that the sweep gas passes outwardly towards the peripheral wall and out the exhaust opening 26. Likewise, sweep gas introduced through a further sweep gas port at the lower end of axle 28 (not shown) passes into the interior of cover 126, outwardly through holes 127 and is impelled outwardly by vanes 128.

As best appreciated with reference to FIG. 1, top end disc 48 isolates the wafers or substrates from the sweep gas and, conversely, isolates the bearings 110, 112 and 114 from the depositing gases. Thus, the coating or depositing gases are discharged only within the gap 52 between the end discs, whereas these bearings are disposed on the outer or outboard side of the end discs, on the opposite sides of these discs from the depositing gas flow. The sweep gas passing out of top cover 120 through holes 123 bathes the brackets 82 to isolates these brackets from the depositing gas. The sweep gas introduced into bottom cover 126 likewise protects brackets 85. A small portion of the sweep gas introduced into bottom cover 126 leaks upwardly, through the spaces between the balls in bearing 106, to thereby protect this bearing as well from the depositing gas.

After the desired coatings have been applied to the substrates or wafers, the flow of the final depositing gas is terminated and the supply of electric power to the heating elements is interrupted. The substrates and susceptors are cooled by directing further inert purge gas through the gas injection tube and over the substrates and susceptors. The cooling process may be materially accelerated by maintaining rotation of the carousel assembly to provide effective contact between the cooling purge gas and the susceptors and substrates. After the substrates have cooled sufficiently so that they may be exposed to the atmosphere, the gas flow and rotation are stopped and handling port 15 is opened by removing cover 17. Motor 134 is operated in a stepping or jogging mode to align one of the apertures 54 in the top end disc (FIG. 5) with port 15. The susceptor 86 aligned with such aperture is then lifted out of the carousel assembly through such aperture and out of the chamber through the handling port. The removed susceptor is then replaced with another susceptor carrying untreated substrates or wafers. The remaining susceptors are removed and replaced with additional susceptors carrying untreated wafers or substrates in the same manner, whereupon port 15 is reclosed by cover 17 and the entire process is repeated. While the process is repeated, the previously treated substrates or wafers are removed from the susceptors used on the last cycle, and those susceptors are reloaded with additional treated wafers for the next cycle. Thus, the chamber may be used continually with only the brief interruptions required to remove and replace susceptors.

The temperatures required for effective deposition will depend upon the nature of the depositing gas and the desired reaction. Many commonly used depositing gases require extremely high temperatures at the substrate face. These gases, however, should be protected from high temperatures until they are injected into the chamber itself so as to avoid premature reaction of the gas components. Thus, center axle 28, and particularly depositing gas inlet tube assembly 34 must be cooled while the carousel assembly, and particularly the susceptors, are heated. This differential heating causes differential thermal expansion of the apparatus components.

Several features of the apparatus compensate for such differential expansion. As pointed out above, bearing 106 restrains the lower end disc 46 of the carousel structure against axial movement relative to the center axle 28. However, bearings 110, 112 and 114 are free to move axially with respect to collar 108. Thus, the upper end disc 48 of the carousel structure may move axially with respect to the center axle so as to compensate for thermal expansion of the carousel structure. Further, spring 118 (FIG. 5) maintains engagement between bearings 110, 112 and 114 and the collar 108 despite radial expansion of top end disc 48. The metallic susceptors 86, typically molybdenum, will expand to a greater extent than the ceramic susceptor support shafts 56. However, the same features which permit axial movement of the susceptor relative to the susceptor support shafts serve to compensate for this differential expansion. Thus, tongue 96 will be moved further into slot 104 upon expansion of the susceptor.

The apparatus also provides good resistance to the mechanical stresses induced by high speed rotation. The rotating carousel is supported by bearings at both ends. Each of susceptor support shafts 56 is likewise supported at both ends. The sheet-like filament portion 76 of each electrical heating element 72 is supported against outward movement away from central axis 13 by the central portion 78 of the susceptor support shaft (FIG. 4). Thin graphite resistive heating elements may be employed without breakage caused by centrifugal stresses. Inasmuch as the pockets 92 in susceptors 86 face inwardly, toward central axis 13, the substrates or wafers are firmly retained in the pockets by the apparent centrifugal force on each wafer during rotation. The fasteners 94 are provided only to resist accidental disengagement of the wafers from the pockets, as during loading and unloading of the susceptors into and out of the chamber.

Any conventional depositing gas employed in conventional vapor deposition processes can be used with the present methods and apparatus. The same substrate temperatures may be employed in the present methods as are employed in conventional methods using the same depositing gases. As pointed out above, higher gas flow velocities across the substrate face may be employed in the present processes than in conventional processes while still maintaining good coating uniformity. Likewise, the pressures employed within the chamber may be somewhat higher than those typically employed with comparable depositing gases, so as to thereby provide greater deposition rates.

Numerous variations and combinations of the features described above may be utilized within the scope of the present invention. In one variant, each susceptor is arranged to hold more than one row of substrates. Also, the path described by each substrate or wafer need not be circular. For example, movement of the substrates or wafers in an elliptical or helical path about the central axis will provide a centrifugal pumping action similar to that achieved with circular motion. Also, where the depositing gas does not require elevated temperatures for reaction with the substrate, the substrates need not be heated during the process. Thus, apparatus for use with such depositing gases need not incorporate heating means. Further, although the electrical resistance heating elements described above are preferred, other heating means, such as infrared or electromagnetic heating may be employed. Moreover, the apparatus and method described above can be modified to employ an etching gas, rather than a depositing gas. Where the etching gas must be ionized, the apparatus can be provided with ionizing devices such as gas discharge electrodes and/or microwave devices either within the chamber or in the active gas supply means. The susceptors can serve as electrodes, and can be connected to a source of electrical energy through rotary connectors similar to those employed for feeding current to the heaters.

As these and other variations and combinations of the features set forth above may be employed, the foregoing description of the preferred embodiments should be taken as merely illustrating, rather than limiting, the scope of the present invention as defined in the claims.

What is claimed is:

1. A method of treating a substrate having a front face with an active gas comprising moving said substrate along a predetermined horizontal circular path in a first direction such that said substrate has an instantaneous velocity vector along said predetermined circular path, projecting said active gas from a point within said predetermined circular path horizontally outwardly across said predetermined circular path, and maintaining the front face of the substrate transverse to said predetermined circular path in a manner such that a vector normal to said front face of said substrate lies between said instantaneous velocity vector of said substrate along said predetermined circular path and said radius of said circular path whereby each portion of said active gas impinges only once on said front face of said substrate as it passes outwardly across said predetermined circular path.

2. A method of claim 1 wherein said substrate is maintained in front face leading orientation during said moving step, whereby the front face of the substrate advances into the active gas and impels said active gas into rotational flow about said predetermined circular path to thereby pump said active gas outwardly therefrom.

3. A method as claimed in claim 2 wherein said substrate is moved along said predetermined circular path within a chamber, and discharging said active gas from a peripheral region of said chamber outside of said predetermined circular path.

4. A method as claimed in claim 3 wherein in said moving step, a plurality of substrates are moved simultaneously along said predetermined circular path.

5. A method as claimed in claim 4 wherein said substrates are disposed in a single, loop-like layer extending along said predetermined circular path so that each portion of said plurality active gas contacts only one of said substrates in passing from within said predetermined circular path to said peripheral region.

6. A method as claimed in claim 4 wherein the front face of each of said substrates is maintained at a rake angle greater than 0° and less than 90° during said moving step so that the front face of each substrate faces inwardly towards said axis and forwardly along the circular path described by the substrate.

7. A method as claimed in claim 6 wherein each of said substrates is rotated about said axis with a centripetal acceleration of at least about 750 cm/sec$^2$.

8. The method of claim 7 wherein said active gas is a depositing gas.

9. A method of claim 8 wherein each of said substrates is maintained at an elevated temperature during said moving step to promote reaction of said depositing gas.

10. A method as claimed in claim 9 wherein said depositing gas deposits an epitaxial film on the front face of said substrate.

11. A method as claimed in claim 8 wherein the pressure in said chamber is at least about 0.1 atmosphere during said depositing step.

12. A method as claimed in claim 8 further comprising the step of terminating flow of the said depositing gas into said central region of said chamber and then introducing a further depositing gas into said central region while continuing the rotational movement of said substrates to thereby contact said further depositing gas with said substrates.

13. A method as claimed in claim 12 further comprising the step of introducing a purge gas into said central region of said chamber between the first said depositing gas and the said further depositing gas.

14. A method as claimed in claim 1 wherein said front face of said substrate is maintained at a rake angle of between about 5° and about 30° during said moving step so that said front face of said substrate faces inwardly of said predetermined circular path.

15. A method as claimed in claim 14 wherein said front face of said substrate is maintained at a rake angle of between about 8° and about 20°.

16. A method as claimed in claim 1 wherein said entire front face of said substrate is maintained at a substantially uniform temperature during said moving step so as to promote uniform reaction of said depositing gas.

17. A method of treating a plurality of substrates, each having a front face, with an active gas, comprising the steps of projecting the active gas in a predetermined flow direction and moving the substrates along a path transverse to said flow direction while maintaining the front face of each substrate oblique to said flow direction, so that each portion of the active gas impinges only once on only one of said substrates.

* * * * *